United States Patent
Murphy

(10) Patent No.: US 10,862,480 B2
(45) Date of Patent: Dec. 8, 2020

(54) CONTROLLED ACTIVE RESISTANCE

(71) Applicant: pSemi Corporation, San Diego, CA (US)

(72) Inventor: Christopher C. Murphy, Lake Zurich, IL (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/276,482

(22) Filed: Feb. 14, 2019

(65) Prior Publication Data

US 2020/0266815 A1 Aug. 20, 2020

(51) Int. Cl.
*H03K 17/687* (2006.01)
*H03F 3/45* (2006.01)
*G01K 7/16* (2006.01)

(52) U.S. Cl.
CPC ....... *H03K 17/687* (2013.01); *H03F 3/45071* (2013.01); *G01K 7/16* (2013.01); *H03F 2200/129* (2013.01); *H03F 2203/45116* (2013.01); *H03F 2203/45524* (2013.01);
(Continued)

(58) Field of Classification Search
CPC ......... H01L 2924/0002; H01L 2924/00; H03F 2200/129; H03F 2200/294; H03F 2200/372; H03F 3/45071; H03F 2203/45524; H03F 2203/45528; H03F 2203/45116; H03F 2203/45536; H03K 17/687; G01K 7/16
See application file for complete search history.

(56) References Cited

U.S. PATENT DOCUMENTS 6,816,987 B1 * 11/2004 Olson ............... H04L 43/50
714/704
8,446,209 B1 * 5/2013 Horsky ............... H03B 5/08
327/513
(Continued)

OTHER PUBLICATIONS

Costa, et al., "Power Detector with Wide Dynamic Range", patent application dated Feb. 14, 2019, U.S. Appl. No. 16/276,494, 32 pgs.
(Continued)

*Primary Examiner* — Sibin Chen
(74) *Attorney, Agent, or Firm* — Jaquez Land Greenhaus LLP; Alessandro Steinfl, Esq.

(57) ABSTRACT

A controlled active resistance. The active resistance is implemented on an integrated circuit. In some embodiments, the active resistance includes a MOSFET. In alternate embodiments, the active resistance includes a MOSFET and a resistor. The control for the active resistance includes a reference resistor and an operational amplifier. The control for the active resistance further includes two current sources: i) a current source producing a current that is proportional to absolute temperature, and ii) another current source that is produced by a bandgap voltage reference. In one aspect, the active resistance generates an effective resistance that is proportional to thermal voltage. In another aspect, the active resistance generates an effective resistance that is proportional to inverse of the thermal voltage. In an alternate aspect, the current sources have various dependencies, and the active resistance generates an effective resistance that is proportional to those dependencies.

13 Claims, 6 Drawing Sheets

(52) U.S. Cl.
CPC .............. *H03F 2203/45528* (2013.01); *H03F 2203/45536* (2013.01)

(56) References Cited

U.S. PATENT DOCUMENTS

| | | | | |
|---|---|---|---|---|
| 2008/0068091 A1* | 3/2008 | Kwan | ....................... | H03L 7/00 331/16 |
| 2012/0019304 A1* | 1/2012 | Chen | .................... | H03D 7/1433 327/355 |
| 2012/0319738 A1* | 12/2012 | Nakamura | .............. | H03L 1/022 327/102 |
| 2013/0162454 A1* | 6/2013 | Lin | ........................ | H03M 1/38 341/120 |
| 2016/0211031 A1* | 7/2016 | Taigor | .................... | G11C 16/28 |
| 2020/0264217 A1 | 8/2020 | Costa et al. | | |

OTHER PUBLICATIONS

Kugelstadt, Thomas, "Integrated Logarithmic Amplifiers for Industrial Applications", Amplifiers: Op Amps, Texas Instruments Incorporated, Analog Applications Journal, 1Q 2004, pp. 28-33, (6 pgs.).
Thangarasu, et al., " A 0.029 mm2 8 Bit/s Current-Mode AGC Amplifier with Reconfigurable Closed-Loop Control in 65 nm CMOS", IEEE, 2017, pp. 107-110 (4 pgs).

* cited by examiner

CONTROLLED ACTIVE RESISTANCE

CROSS-REFERENCE TO RELATED APPLICATIONS

The present application may be related to U.S. patent application Ser. No. 16/276,494 filed on even date herewith, entitled "Power Detector With Wide Dynamic Range", the contents of which are incorporated herein by reference in their entirety.

BACKGROUND

(1) Technical Field

The present teachings generally relate to electronic circuits, and more specifically to an active resistor circuitry that produces a resistance that is proportional to thermal voltage.

(2) Background

Generally, power detection circuitry is used in radio frequency (RF) circuits to measure power. RF circuits generally include transmitter and receiver circuits that have power requirements that vary with use. For example, the power required for signal transmission through an antenna may vary, and it is generally important to monitor the output of the transmitter during use.

Logarithmic converter stages within power detection circuits provide a linear output voltage to an exponential input voltage, which itself is proportional to the power detector input power. Logarithmic power detectors provide a linear-in-dB output voltage and may be used in a range of applications, such as transmit and receive power measurement applications. Logarithmic power detectors may include: i) a voltage to current converter, which generates logarithmic diode voltages, and ii) an amplifier block to amplify the difference in diode voltages. The amplifier block may be referred to as a difference amplifier.

In the above example of the logarithmic power detector, the difference amplifier must amplify a difference between voltages across diodes within the logarithmic voltage to current converter. However, the constant gain of the difference amplifier causes its output voltage to vary by about 60% over a temperature range of −40 C to 100 C. The reason for this wide variation in the output of the difference amplifier is that the input voltage to the difference amplifier is a function of thermal voltage ($V_T$), a term generated in the logarithmic converter stage. Thermal voltage is a voltage produced within a p-n junction due to the action of temperature. Thermal voltage depends on absolute temperature. Therefore, the input voltage to the difference amplifier dependents directly on absolute temperature, and given a constant gain of the difference amplifier, the output voltage of the difference amplifier varies directly with absolute temperature.

Temperature compensation performed at the difference amplifier is preferred because the input voltage and gain of the difference amplifier are linear. It would be desirable to have the gain of the difference amplifier decrease with an increase in temperature, thus cancelling out the input voltage increase with temperature.

Accordingly, there is a need for an active resistance that depends directly on thermal voltage. Such an active resistance would have a value which increases with increased thermal voltage. This type of active resistance could be used in various circuits, for example, to mitigate the variation of the output voltage of a difference amplifier as a function of temperature, and minimize the change in the output voltage of the difference amplifier as a function of temperature.

SUMMARY

Various embodiments of an active resistance are disclosed. Further, various embodiments of a $V_T$-dependent resistor are disclosed. Moreover, various embodiments showing the usage of $V_T$-dependent resistors within circuit applications are also disclosed.

In one disclosed embodiment, a $V_T$-dependent resistor is implemented in an integrated circuit (IC). The $V_T$-dependent resistor has a resistor R2 in series with a MOSFET, and an operational amplifier (OpAmp) driving the gate of the MOSFET. The $V_T$-dependent resistor also includes two current sources: i) one current source producing a current that is proportional to absolute temperature ($I_{PTAT}$), and ii) another current source ($I_{REF}$) produced by taking a ratio of a bandgap voltage reference to a resistor R1. The $I_{PTAT}$ increases as temperature increases, because the $I_{PTAT}$ depends on $V_T$. The $I_{REF}$ current remains constant as a function of temperature, ignoring for now the temperature coefficient of all resistors, which are the same type. The $I_{PTAT}$ drives the input to the OpAmp and generates a voltage that is proportional to absolute temperature ($V_{PTAT}$). The $I_{REF}$ is driven into the feedback node of the OpAmp. The feedback loop forces an increasing voltage ($V_{PTAT}$) across a constant current $I_{REF}$, thus producing an effective resistance that is also increasing. The effective series resistance ($R_{SUM}$) of R2 and the MOSFET becomes a function of $I_{PTAT}$, which means that $R_{SUM}$ varies with $V_T$.

In another embodiment, the two current sources in the $V_T$-dependent resistor can be swapped, so that constant current $I_{REF}$ is driven into the input of the OpAmp, generating a voltage $V_{REF}$. The $I_{PTAT}$ is driven into the feedback node of the OpAmp. Therefore, $R_{SUM}$ now varies with $1/V_T$.

In some embodiments, current sources with various dependencies can be used, which are not just dependent on temperature. As an example, the current sources could depend on a voltage, or on a device parameter such as threshold voltage of that device, or on any other variable that could create a dependent current source.

In yet another embodiment, various current sources can be summed together at a node. For example, different amounts of a bandgap referenced current (which is constant as a function of temperature), and current that is proportional to the absolute temperature (which varies with temperature), can be summed in order to create any arbitrary slope for $R_{SUM}$ as a function of temperature. It will be understood by those skilled in the art that an active resistor can be created that is dependent on any variable or combination of variables, if the variables are expressed in the form of a current.

In yet another alternate embodiment, a controlled active resistance is presented, the controlled active resistance comprising a first resistive element, a first active element, an operational amplifier, having a first input connected to the first resistive element, a second input connected to the first active element, and an output connected to the first active element, and a first current source connected to the first active element and a second current source connected to the first resistive element, wherein the first resistive element, the operational amplifier, the first current source and the second current source are configured, in combination, to control the first active element, and cause the first active element to act as an active resistance.

BRIEF DESCRIPTION OF THE DRAWINGS

The disclosed apparatus, in accordance with one or more various embodiments, are described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

Like reference numbers and designations in the various drawings indicate like elements.

Definitions

The term thermal voltage as used throughout the present disclosure will be used to mean a voltage produced within a p-n junction due to the action of temperature. Thermal voltage depends on absolute temperature and can be given by:

$$V_T = (k \cdot T)/q$$

where:
 $V_T$=Thermal Voltage
 k=Boltzmann's constant
 T=Temperature in Kelvin
 q=elementary charge ($1.602 \times 10^{-19}$ Coulomb)

The terms resistor, resistance, and resistive element will be used interchangeably throughout the present disclosure to indicate two-terminal electrical component that implements electrical resistance as a circuit element.

The terms active resistance and active resistor will be used throughout the present disclosure to mean compound elements within an electrical circuit that behave as a resistor, but whose behavior is controlled by another active element such as an operational amplifier, as distinguished from a passive resistor, which is an element whose behavior is purely based on its own characteristics and not controlled by another element.

DETAILED DESCRIPTION

Figure 1:
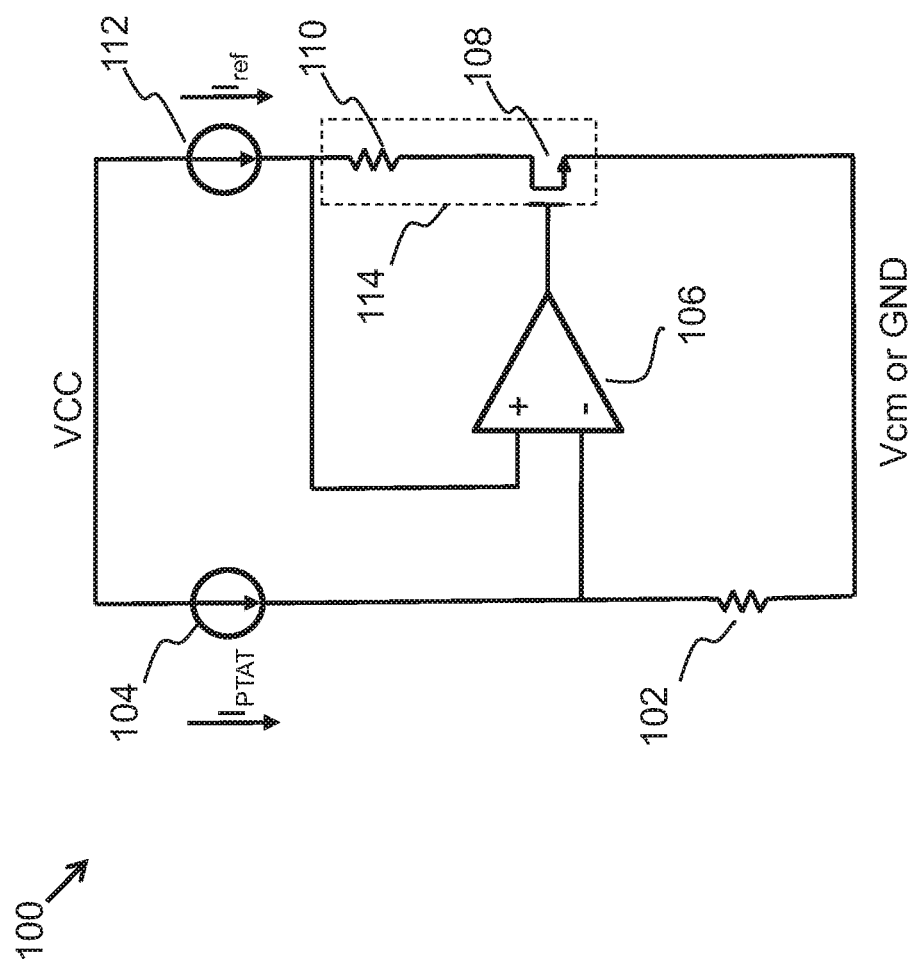
FIG. 1 shows an electrical schematic of a $V_T$-dependent resistor in accordance with one embodiment of the disclosed apparatus.

FIG. 1 shows an electrical schematic of a $V_T$-dependent resistor in accordance with one embodiment of the disclosed apparatus. The operation of the schematic 100 is described in more detail below.

As shown in FIG. 1, the $V_T$-dependent resistor includes a resistor 110 in series with a MOSFET 108, and an operational amplifier (OpAmp) 106 driving the gate of the MOSFET 108. The $V_T$-dependent resistor also includes two current sources: i) current source 104 producing a current that is proportional to absolute temperature ($I_{PTAT}$), and ii) current source ($I_{REF}$) 112, which is produced by taking a ratio of a bandgap voltage reference to a resistor R1 (not shown in FIG. 1). $I_{PTAT}$ 104 increases as temperature increases because the $I_{PTAT}$ depends on $V_T$. The $I_{REF}$ 112 current remains constant as a function of temperature, for now ignoring temperature coefficients of R1 and all passive resistors. $I_{PTAT}$ 104 is driven into resistor 102, which has a value $R_T$. The resulting voltage drives the inverting input to the OpAmp 106 and generates a voltage that is proportional to absolute temperature ($V_{PTAT}$). $T_{REF}$ 112 is driven into the feedback node of the OpAmp. The feedback loop forces an increasing voltage ($V_{PTAT}$) across a constant current $I_{REF}$, thus producing an effective resistance that is also increasing proportionally with temperature. The effective series resistance of the block 114, also referred to as $R_{SUM}$, becomes a function of $I_{PTAT}$ 104, therefore $R_{SUM}$ varies with $V_T$. $R_{SUM}$ is given by:

$$Rsum = \frac{RT \cdot IPTAT}{Iref} \qquad \text{Eq. 1}$$

After substituting terms for $I_{PTAT}$ and $I_{REF}$:

$$R_{SUM} = \frac{R_1 R_T \cdot k V_T \ln N}{R_{BG} \cdot vbg} \qquad \text{Eq. 2}$$

where k is a current scalar out of a bandgap reference generator, N is the current density ratio of diodes in the bandgap reference generator, $R_{BG}$ is the internal resistance across the $V_{PTAT}$ within the bandgap reference generator, $V_{bg}$ is the voltage generated by the bandgap reference generator, and Vbg/R1 is the $I_{REF}$ current.

As can be seen in Eq. 2, $R_{SUM}$ varies directly with $V_T$. $I_{PTAT}$ and $I_{REF}$ may be chosen such that a unity gain factor can be attained at any temperature. In some examples, gain factor varies from 1.0 to 1.6 over temperatures of −40 C to 100 C. It is not required that $R_{SUM}$ 114 include a passive resistor 110; rather, $R_{SUM}$ 114 could comprise only of an active device. In the example shown in FIG. 1, an NMOS device 108 is shown; however, it will be understood by those skilled in the art that the device employed could be a PMOS or any other device type.

In a further embodiment of the $V_T$-dependent resistor, the two current sources in the $V_T$-dependent resistor schematic can be swapped, so that constant current $I_{REF}$ is driven into the input of the OpAmp 106, generating a voltage $V_{REF}$. The $I_{PTAT}$ is driven into the feedback node of the OpAmp. Therefore, $R_{SUM}$ will vary with $1/V_T$.

In some embodiments of the $V_T$-dependent resistor, current sources with various dependencies, which are not just dependent on temperature can be used. As an example, the current sources could depend on a voltage, or on a device parameter such as threshold voltage of that device, or on any other variable that could create a dependent current source.

In yet another embodiment of the $V_T$-dependent resistor, various current sources can be summed together at a node. For example, different amounts of a bandgap referenced current (which is constant as a function of temperature), and current that is proportional to the absolute temperature (which varies with temperature), can be summed in order to create any arbitrary slope for $R_{SUM}$ as a function of temperature. It will be understood by those skilled in the art that an active resistor can be created that is dependent on any variable or combination of variable, if the variables are expressed in the form of a current. It is not required that the active resistor Rsum (114) include a passive resistor. Rsum can include an active device and a resistor or just an active device.

Figure 2:
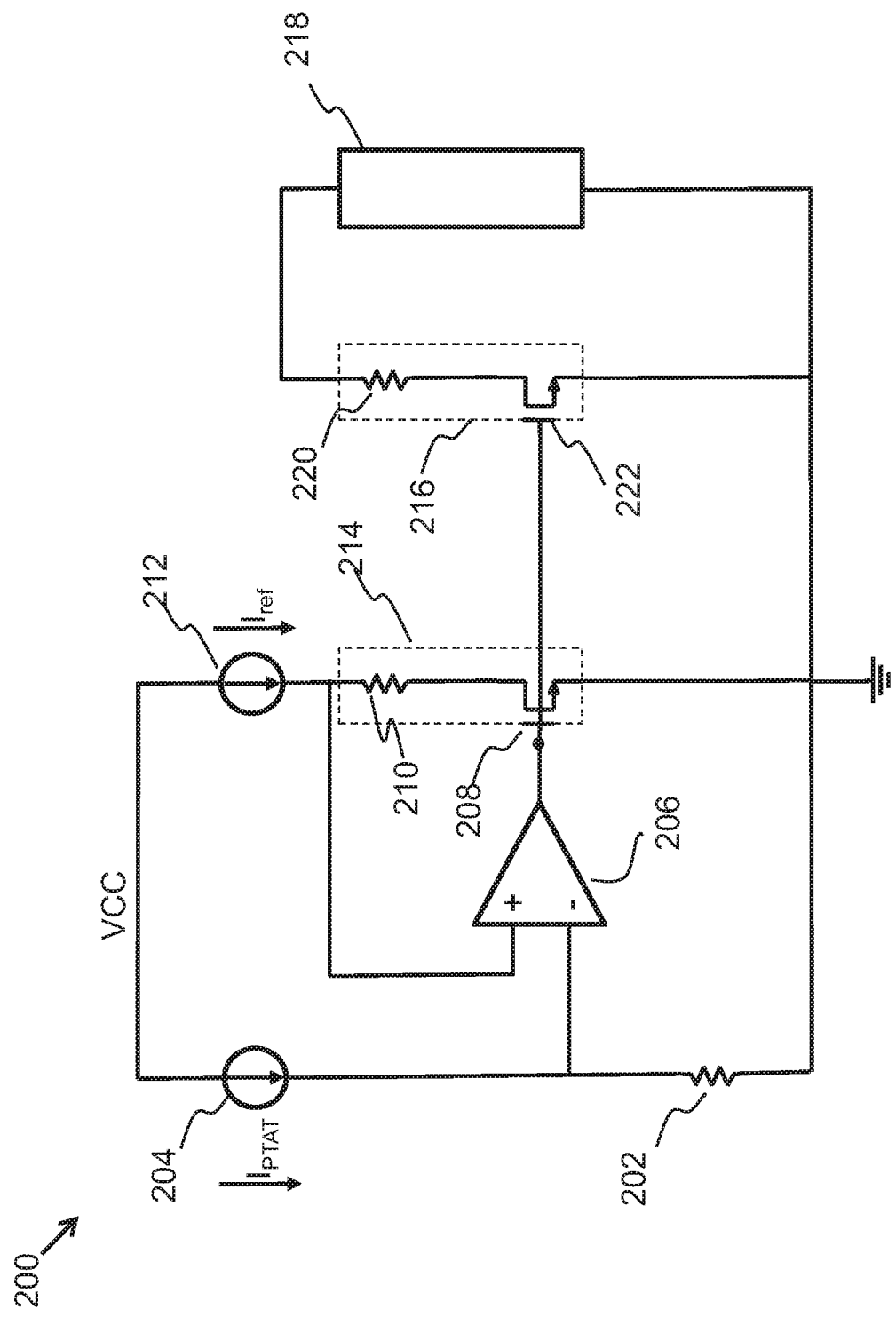
FIG. 2 shows an electrical schematic of a ground referenced $V_T$-dependent resistor in accordance with another embodiment of the disclosed apparatus.

FIG. 2 shows an electrical schematic of a ground referenced $V_T$-dependent resistor in accordance with another embodiment of the disclosed apparatus. The $V_T$-dependent resistor is an active resistor and may be used in ground referenced scheme or in a floating scheme. FIG. 2 depicts a ground referenced active resistor. In FIG. 2, the $V_T$-dependent resistor of FIG. 1 is connected to an external circuit. In FIG. 2 the active resistor circuit of FIG. 1 is combined with a similar circuit 216 that makes use of the active resistor properties. The circuit of FIG. 1 is required to create the control signal (gate voltage) for the active resistor, while the circuit of FIG. 2 further uses this to control a separate active resistor 216. As typical in IC design, the MOSFET and resistors in blocks 214 and 216 can be identical or scaled copies. In the limit case they could be different device types, but the desired active resistor function is mirrored from 214 to 216 most accurately if the device types and voltages are as similar as possible. Device matching is an inherent strength of integrated circuits and makes this circuit feasible.

This external circuit includes an active resistor 216 and block 218. The OpAmp 206 which drives the active resistor 214, also drives the device in the replica resistor 216. Block 218 is a circuit that makes use of the replica resistor 216. Used in this manner, the external circuit can detect a change in the active resistor 214 as it varies with $V_T$ (or varies with any parameter contained in the input current profile generating the active resistor).

In FIG. 2 schematic, a voltage that changes excessively across active device 222, compared to the voltage across its replica device 208, will generate errors that could be managed by the person designing the circuit.

Figure 3:
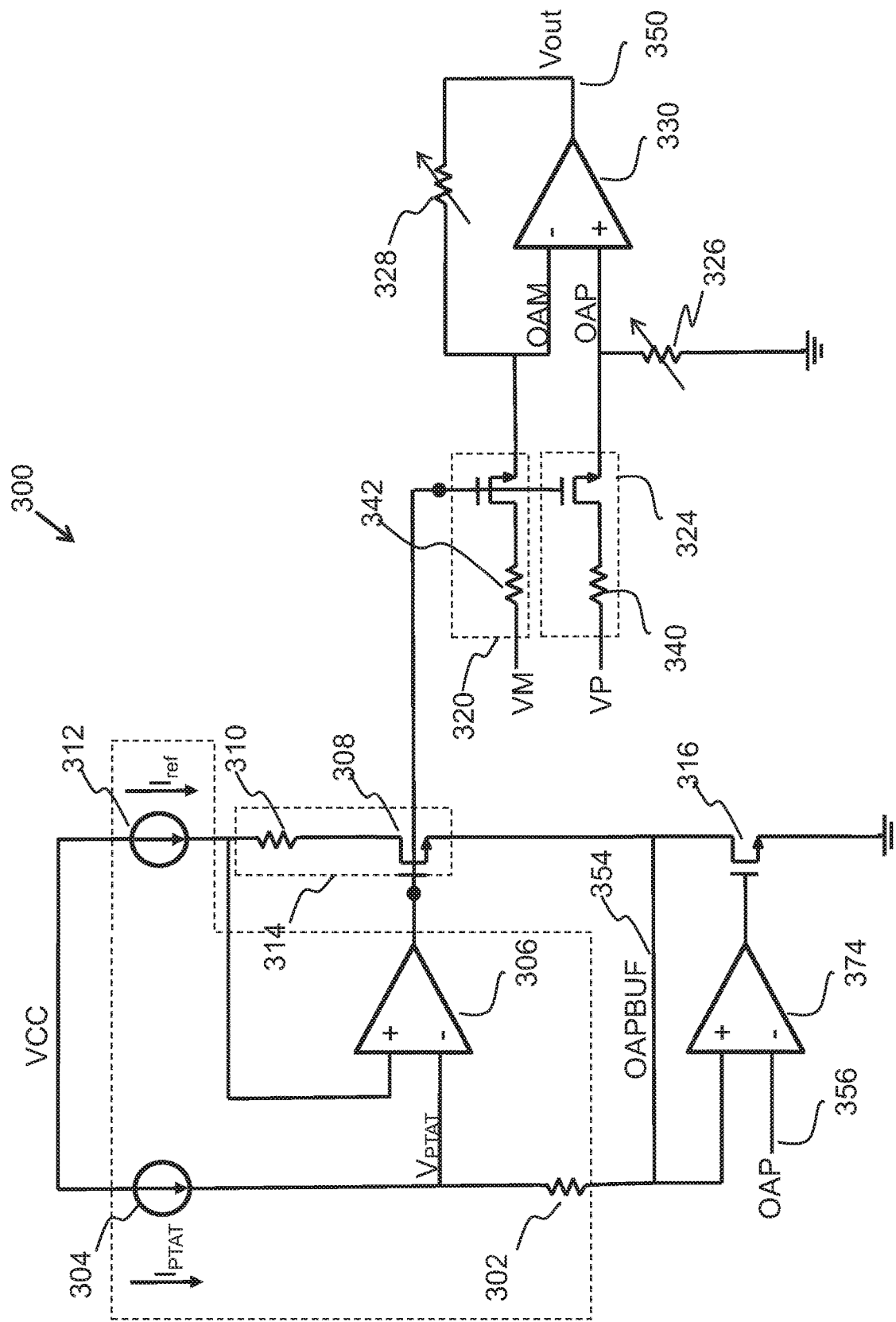
FIG. 3 shows an electrical schematic of a bias circuit for $V_T$-dependent resistor coupled to a difference amplifier in accordance with yet another embodiment of the disclosed apparatus.

FIG. 3 shows an electrical schematic of a bias circuit for $V_T$-dependent resistor coupled to a difference amplifier in accordance with yet another embodiment of the disclosed apparatus. Here, the active resistor is used in a floating configuration. FIG. 3 shows how active resistor blocks 320 and 324 are used in a difference amplifier circuit. One can also see the active resistor control circuit of FIG. 1 as contained in elements 304, 312, 314, 306, and 302. However, the common node of FIG. 1 (Vcm or GND) is now connected to the drain of 316. MOSFET 316 and OpAmp 314 are used to float the active resistor control circuit to a reference voltage that is used with the implemented active resistors 320 and 324. Active resistors 320 and 324 have their MOSFET sources connected to OAM and OAP respectively. Based on the operation of OpAmp 330, OAM should equal OAP. We see that OAP was chosen as the reference for OpAmp 374. OpAmp 374 works to make OAPBUF, or the common node of the active resistor control circuit, equal to OAP and thus OAM. Therefore, the active resistor control circuit and the implemented active resistors 320 and 324 share a common reference voltage.

The active resistors 320 and 324 are replicas of active resistor 314. Further, active resistors 320 and 324, which form the input to the OpAmp 330, are matching. The input voltage into the active resistor 320 is $V_M$ and the input voltage into active resistor 324 is $V_P$. $V_M$ and $V_P$ are voltages across diodes 416 and 410, respectively, in later introduced FIG. 4A.

In FIG. 3 schematic, the value of resistors 326 and 328 are equal. Also, the value of resistors 340 and 342 are equal. The gain of the OpAmp 330 is given by a ratio of the value of the resistors 326 to 324 (or 328 to 320). Thus, the output voltage at the output of OpAmp 330 ($V_{OUT}$) is given by:

$$V_{OUT} = \left(V_T \cdot \ln\frac{I_{IN}}{I_{REF}}\right) \cdot \left(\frac{vbg \cdot R_{BOT} \cdot R_{BG}}{R_1 \cdot R_T \cdot kV_T \ln N}\right) \qquad \text{Eq. 3}$$

The term Vt*ln(Iin/Iref) is the output of the voltage-to-current-to-voltage converter and is the (vp–vm) input signal to the diff amp. Diode ideality factor is ignored, since it is also a constant. It can be seen from Eq. 3 that the thermal voltage is in the numerator and the denominator, therefore it will drop out of the equation. By using only one type of resistor (e.g. polysilicon) for the resistors in Eq. 3, one can minimize variations due to manufacturing processes and temperature variations. Resistor temperature coefficients can now be assumed to be present, since in previous section they were temporarily ignored. The largest remaining errors will be due to random mismatch of the added circuitry, which can be managed by designing low offset OpAmps, and designing low offset current mirrors. It should also be noted that the voltage at node 354 is a buffered version of the voltage at node 356. Furthermore, OAP is buffered instead of OAM, in order to avoid interaction from the difference amplifier 330 feedback loop.

Figure 4A:
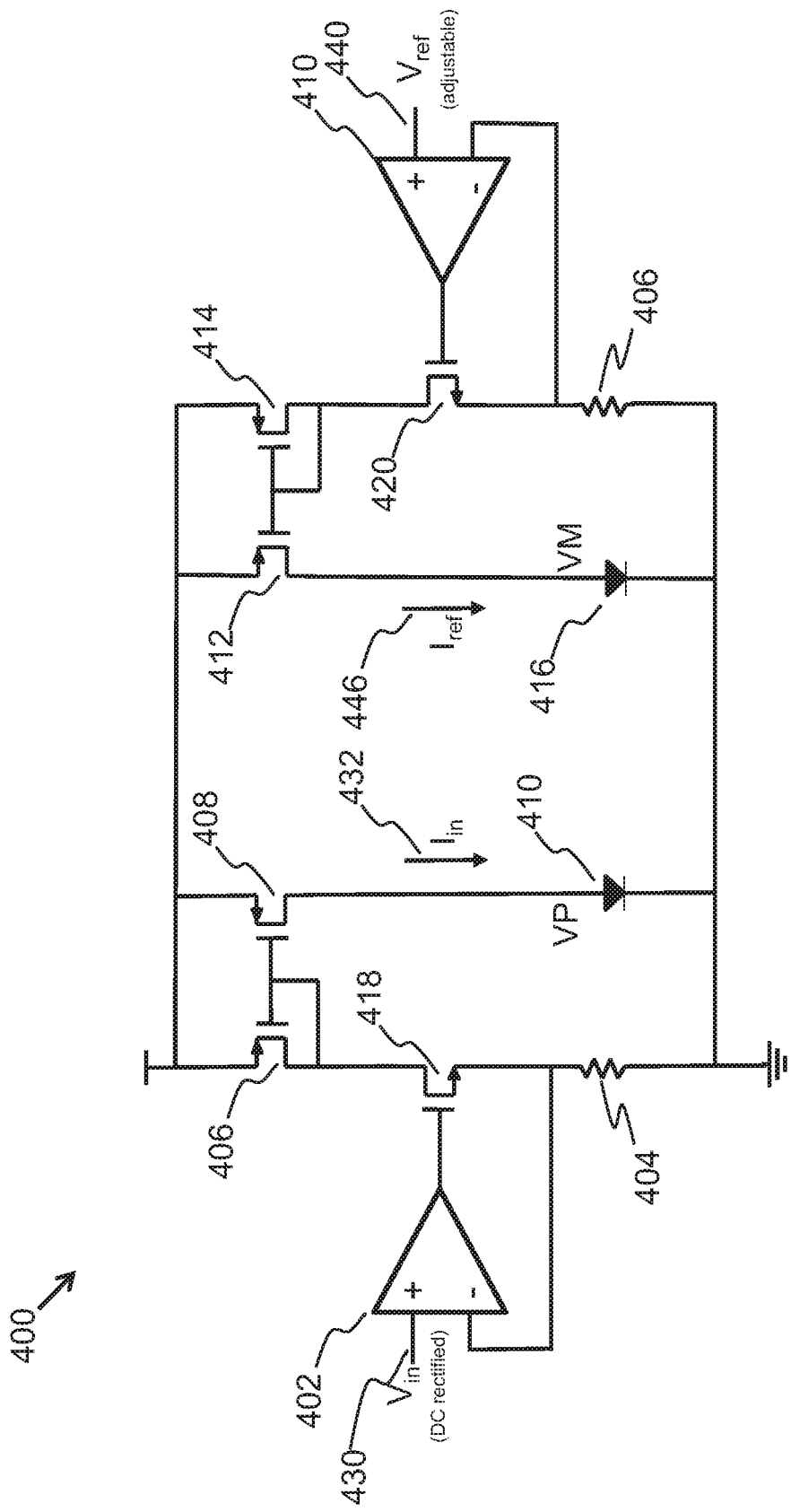
FIG. 4A shows an electrical schematic of a voltage-to-current-to-voltage convertor.
Figure 4B:
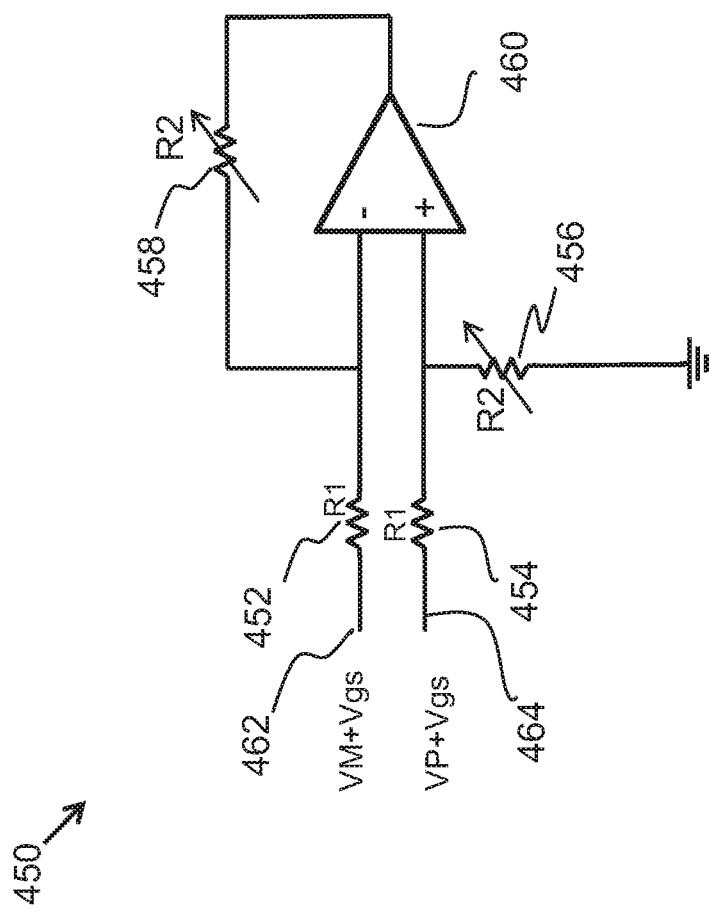
FIG. 4B shows an electrical schematic of a difference amplifier.

FIG. 4A shows an electrical schematic of a voltage-to-current-to-voltage (V-I-V) converter. The current-to-voltage conversion in the voltage-to-current-to-voltage converter is performed logarithmically. FIG. 4B shows an electrical schematic of a difference amplifier. The combination of the schematics in FIGS. 4A and 4B construct the linearization and gain stages of a power detector. In a power detector, the difference in voltages across diodes 410 and 416 in FIG. 4A is amplified by the difference amplifier circuit 450 in FIG. 4B.

The operation of the V-I-V converter schematic in FIG. 4A is explained in detail here. A feedback loop applies the voltage at node 430 (Vin) across resistor 404, thus generating a current 432 (Iin). A reference voltage (Vref) is applied at node 440, which is then applied across resistor 406, thus generating current 446 (Iref). Iin drives into diode 410 and Iref drives into diode 416. Diode 410 develops voltage $V_P$ and diode 416 develops voltage $V_M$. Therefore, the difference in voltages across diodes 410 and 416 is given by:

$$VP - VM \approx V_T \cdot \ln\left(\frac{Iin}{Iref}\right) \qquad \text{Eq. 4}$$

where again the diode ideality factor is ignored because it is a constant. This difference in voltage is driven into the difference amplifier 450 in FIG. 4B. The difference amplifier 450 increases this difference by a gain of the difference amplifier, which is given by the ratio of resistor values R2/R1. The Vgs term in FIG. 4B represents a level-shifting function and is optional per those skilled in the art. Thus, the output voltage of the difference amplifier 450 is given by:

$$V_{OUT} = R2/R1 \cdot (VP - VM) \qquad \text{Eq. 5}$$

The constant gain of the difference amplifier 450 causes its output voltage to vary by upwards of 60% over a temperature range of −40 C to 100 C. The reason for this wide variation in the output of the difference amplifier 450 is that the input voltage to the difference amplifier is a function of $V_T$, as can be seen in Eq. 4. $V_T$ depends on absolute temperature, thus, the input voltage to the difference amplifier 450 depends directly on absolute temperature, and given a constant gain of the difference amplifier, the output voltage of the difference amplifier varies directly with absolute temperature.

The difference in resistor temperature coefficients between different types of resistors used with difference amplifier 450 can be exploited in an effort to maintain a constant voltage at the output of the difference amplifier. Resistors 452 and 454 have equal values R1 and are fabricated from the same semiconductor material, whereas resistors 456 and 458 have equal values R2, and are fabricated from another semiconductor material. These semiconductor materials could, for example, be polysilicon or active diffusion. R1 and R2 have different coefficients of temperature. The ratio of R2 to R1 can be used in an effort to minimize the ratio's temperature dependence; however, semiconductor processing variations can cause the nominal values or the difference in the rate of change of the resistances R1 and R2 as a function of temperature to change significantly due to the fact that different types of resistors, such as resistors fabricated out of polysilicon or active diffusion, are uncorrelated and fluctuate differently with process variations.

Figure 5:
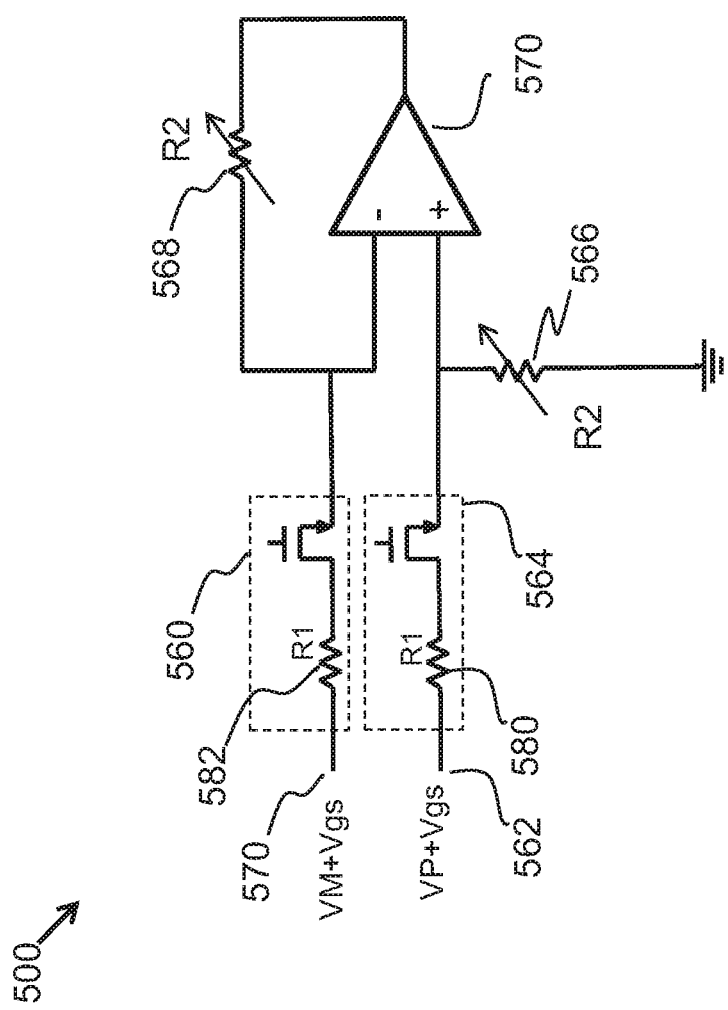
FIG. 5 shows an electrical schematic of a difference amplifier in accordance with an alternate embodiment of the disclosed apparatus.

On the other hand, FIG. 5 shows an electrical schematic of a difference amplifier circuit 500, which utilizes the presently claimed active resistor to minimize the variation of its output voltage. Whereas the schematic in FIG. 4B uses passive resistors 452 and 454, and the difference amplifier circuit 450 suffers from large output voltage variations, the schematic in FIG. 5 replaces those passive resistors with active resistors 560 and 564, thus enabling the difference amplifier circuit 500 to have minimal output voltage variation as a function of temperature.

By replacing passive resistors with active resistors, Equations 2, 4 and 5 can be combined to derive the output voltage of difference amplifier 500, which is now given by:

$$V_{OUT} = \left(V_T \cdot \ln\frac{I_{IN}}{I_{REF}}\right) \cdot \left(\frac{vbg \cdot R_{BOT} \cdot R_{BG}}{R_1 \cdot R_T \cdot kV_T \ln N}\right) \qquad \text{Eq. 6}$$

It can be seen from Equation 6 that $V_T$ is in the numerator and the denominator, therefore it will drop out of Equation 6. By using only one type of resistor for the resistors in Equation 6, manufacturing process and temperature variations can be minimized.

It will be understood by those skilled in the art that the principle of an active resistor can be used in any OpAmp circuit with resistors used to set the gain and/or set the pole/zero stability compensation. This principle can be used in active filters, or temperature sensors, among others.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A floating active resistance circuit, comprising:
   a first resistive element;
   a first active element having an input terminal, a control terminal and an output terminal;
   a second active element having an input terminal, a control terminal and an output terminal;
   a first operational amplifier, having a first input connected to the first resistive element, a second input connected to the input terminal of the first active element, and an output connected to the control terminal of the first active element;

a second operational amplifier, having a first input connected to a reference voltage, a second input connected to the first resistive element and the output terminal of the first active element, and an output connected to the control terminal of the second active element; and a first current source connected to the first active element and a second current source connected to the first resistive element, wherein the first resistive element, the first operational amplifier, the first current source and the second current source are configured, in combination, to control the first active element, and cause the first active element to act as an active resistance, and the second operational amplifier and the second active element are configured to create a floating node for the active resistance.

2. The floating active resistance circuit of claim 1, further comprising one or more active resistances, wherein the one or more active resistances are controlled by the output of the first operational amplifier.

3. The floating active resistance circuit of claim 2, wherein the one or more active resistance includes at least one MOSFET.

4. The floating active resistance of claim 1, wherein the first active element is a MOSFET.

5. The floating active resistance of claim 1, wherein the first active element further comprises a second resistive element.

6. The floating active resistance of claim 1, wherein the first active element comprises a MOSFET.

7. The floating active resistance of claim 6, wherein the first active element further comprises a second resistive element.

8. The floating active resistance of claim 1, wherein the second active element is a MOSFET.

9. The floating active resistance of claim 1, wherein the first active element comprises a MOSFET.

10. The floating active resistance of claim 1, wherein the second active element is connected to ground.

11. The floating active resistance of claim 1, wherein the first current source is proportional to a characteristic.

12. The floating active resistance of claim 11, wherein the characteristic is temperature.

13. The floating active resistance of claim 1, wherein an input voltage to one of the one or more active resistances is a voltage across a first diode of a difference amplifier and an input voltage to another of the one or more active resistances is a voltage across a second diode of the difference amplifier.

* * * * *